United States Patent
Jun

[19]

[11] Patent Number: 5,899,717
[45] Date of Patent: May 4, 1999

[54] METHOD FOR FABRICATING SEMICONDUCTOR DEVICE

[75] Inventor: Young Kwon Jun, Seoul, Rep. of Korea

[73] Assignee: LG Semicon Co., Ltd., Chungcheongbuk-do, Rep. of Korea

[21] Appl. No.: 08/686,678

[22] Filed: Jul. 26, 1996

[30] Foreign Application Priority Data

Dec. 20, 1995 [KR] Rep. of Korea ............. 95-52933

[51] Int. Cl.⁶ ..................................... H01L 21/336
[52] U.S. Cl. .................. 438/262; 438/296; 438/439; 438/155
[58] Field of Search ..................... 438/262, 296, 438/439, 155; 257/68, 306, 309

[56] References Cited

U.S. PATENT DOCUMENTS

| | | | |
|---|---|---|---|
| 5,140,389 | 8/1992 | Kimura et al. | 357/23.6 |
| 5,180,687 | 1/1993 | Mikoshiba et al. | 437/187 |
| 5,200,635 | 4/1993 | Kaga et al. | 257/306 |
| 5,447,879 | 9/1995 | Park | 438/155 |
| 5,453,397 | 9/1995 | Ema et al. | 438/439 |
| 5,656,513 | 8/1997 | Wang et al. | 438/262 |
| 5,663,585 | 9/1997 | Lee et al. | 257/296 |

*Primary Examiner*—John F. Niebling
*Assistant Examiner*—John Murphy
*Attorney, Agent, or Firm*—Morgan, Lewis & Bockius LLP

[57] ABSTRACT

A method for fabricating a semiconductor device includes the steps of forming a field oxide layer on a first conductivity-type semiconductor substrate, and forming a pattern of first active regions. The field oxide layer is selectively removed between the first active regions to pattern a second active region and word lines are formed substantially perpendicular to each of the first active regions. A second conductivity-type impurity is implanted into the substrate using a mask to form impurity diffusion regions in the first and second active regions. A first insulating layer is formed over an overall surface of the substrate, and forming a first contact hole in the second active region. A bit line is formed for contacting with the impurity diffusion region on the second active region through the first contact hole. A second insulating layer is formed over the first insulating layer and the bit line, and the second impurity layer is selectively removed to form second contact holes on portions of the first active regions, respectively.

30 Claims, 17 Drawing Sheets

METHOD FOR FABRICATING SEMICONDUCTOR DEVICE

BACKGROUND OF THE INVENTION

1. Field of the Invention

The present invention relates to a method for fabricating a semiconductor device, and more particularly, to a method for fabricating a semiconductor device with high reliability and density.

2. Discussion of the Related Art

As semiconductor devices become highly integrated, the size tends to decrease. Line widths of patterns for forming such highly integrated semiconductor devices and intervals between the line widths reach a resolution limit for photolithography Particularly, in a dynamic random access memory (DRAM), if a storage capacitance is reduced in accordance with a reduction in the size of a memory cell, it becomes difficult to store and transmit information accurately. Moreover, information may be distorted due to alpha particles. This deteriorates the reliability of a device.

Therefore, to obtain a sufficient storage capacitance in a limited area, studies have been done for a stacked capacitor cell in which a capacitor is formed on a switching transistor. In this case, however, after forming the capacitor, a bit line for transmitting a signal to the switching transistor must be connected to a source or drain of the switching transistor, which is spaced apart from a storage electrode or plate electrode of the capacitor. This puts a restriction on how much the surface area of the capacitor can be increased.

An interconnection of a conventional semiconductor device will be explained below with reference to the accompanying drawings FIG. 1 is a layout showing an interconnection of a conventional semiconductor device as disclosed in U.S. Pat. No. 5,200,635.

As shown in FIG. 1, a bit line 1 is formed first before a capacitor is formed to thereby increase the area of a storage electrode 2 until a minimum interval between neighboring storage electrodes is reached. As a result, the capacitance is increased. In the interconnection described above, the storage electrode 2 should be connected to a source/drain region of a switching transistor, spaced from the bit line 1. Thus, the center or middle portion of an active region 3 forms a 45° angle with word line 4 and bit line 1.

However, since the center of the active region is placed at an angle with the other portions in order to increase the capacitance, the aforementioned conventional interconnection has the following problems. One disadvantage or problem is that during photolithography for forming the active region pattern, distortion of the pattern may occur easily. Also, when a field oxide layer for electrical isolation is formed around the active region, a substrate stress profile at a bending portion of the active region pattern is different from that of the other portions. Accordingly, patterns are not correctly formed.

SUMMARY OF THE INVENTION

Accordingly, the present invention is directed to a method for fabricating a semiconductor device that substantially obviates one or more of the problems due to limitations and disadvantages of the related art.

An object of the present invention is to provide a method for fabricating a semiconductor device that improves its reliability and density.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the invention, as embodied and broadly described, the present invention provides a method for fabricating a semiconductor device including the steps of forming a field oxide layer on a first conductivity-type semiconductor substrate, and forming a pattern of first active regions; selectively removing the field oxide layer between the first active regions to pattern a second active region; forming word lines substantially perpendicular to each of the first active regions; ion-implanting a second conductivity-type impurity into the substrate using a mask to form impurity diffusion regions in the first and second active regions; forming a first insulating layer over an overall surface of the substrate, and forming a first contact hole in the second active region; forming a bit line for contacting with the impurity diffusion region on the second active region through the first contact hole; forming a second insulating layer over the first insulating layer and the bit line; and selectively removing the second insulating layer to form second contact holes on portions of the first active regions, respectively.

In another aspect, the present invention provides a method for fabricating a semiconductor device including the steps of forming a field oxide layer on a first conductivity-type semiconductor substrate, and forming a pattern of first active regions; forming word lines substantially perpendicular to each of the first active regions; selectively removing the field oxide layer between the first active regions to pattern a second active region; ion-implanting a second conductivity-type impurity into the substrate using a mask to form impurity diffusion regions in the first and second active regions; forming a first insulating layer over an overall surface of the substrate, and forming a first contact hole in the second active region; forming a bit line for contacting with the impurity diffusion region on the second active region through the first contact hole; forming a second insulating layer over the first insulating layer and the bit line; and selectively removing the second insulating layer to form second contact holes on portions of the first active regions, respectively.

In another aspect, the present invention provides a method for fabricating a semiconductor device including the steps of forming a field oxide layer on a first conductivity-type semiconductor substrate to pattern a first active region at an angle; forming word lines to cross over the first active region; ion-implanting a second conductivity-type impurity into the substrate using a mask to form first impurity diffusion regions in the first active region; forming a first insulating layer over an overall surface of the substrate; selectively removing the first insulating layer at a central portion of the first active region to form a first contact hole; forming a bit line for contacting with the first impurity diffusion regions on the first active region through the first contact hole; forming a second insulating layer over the first insulating layer and the bit line; selectively removing the second insulating layer to form second contact holes on edges of the first active region including the field oxide layer to pattern a second active region; and ion-implanting a second conductivity-type impurity into the second active region to form second impurity diffusion regions.

In another aspect, the present invention provides a method for fabricating a semiconductor device including the steps of forming a field oxide layer on a first conductivity-type semiconductor substrate to pattern a first active region; forming word lines on the first active region; ion-implanting a second conductivity-type impurity into the substrate using a mask to form first impurity diffusion regions in the first active region; forming a first insulating layer over an overall surface of the substrate; selectively removing the first insulating layer to form a first contact hole on a portion of the substrate including the field oxide layer to pattern a second active region; ion-implanting a second conductivity-type impurity into the second active region to form a second impurity diffusion region; forming a bit line for contacting with the second impurity diffusion region of the second active region through the first contact hole; forming a second insulating layer over the first insulating layer and the bit line, and selectively removing the second insulating layer to form second contact holes on edges of the first active region.

In a further aspect, the present invention provides a method for fabricating a semiconductor device including the steps of forming a field oxide layer on a first conductivity-type semiconductor substrate, and separately patterning first active regions, selectively removing the field oxide layer between the first active regions for patterning a second active region; forming word lines perpendicular to each of the first active regions; ion-implanting a second conductivity-type impurity into the substrate using word lines as a mask to form first impurity diffusion regions in the first and second active regions; forming a first insulating layer on the overall surface of the substrate, and forming a first contact hole on the second active region; forming a bit line for contacting with the impurity diffusion region on the second active region through the first contact hole; and forming a second insulating layer, and forming second contact holes on a predetermined portion of the first active regions, where the word lines are not superposed.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
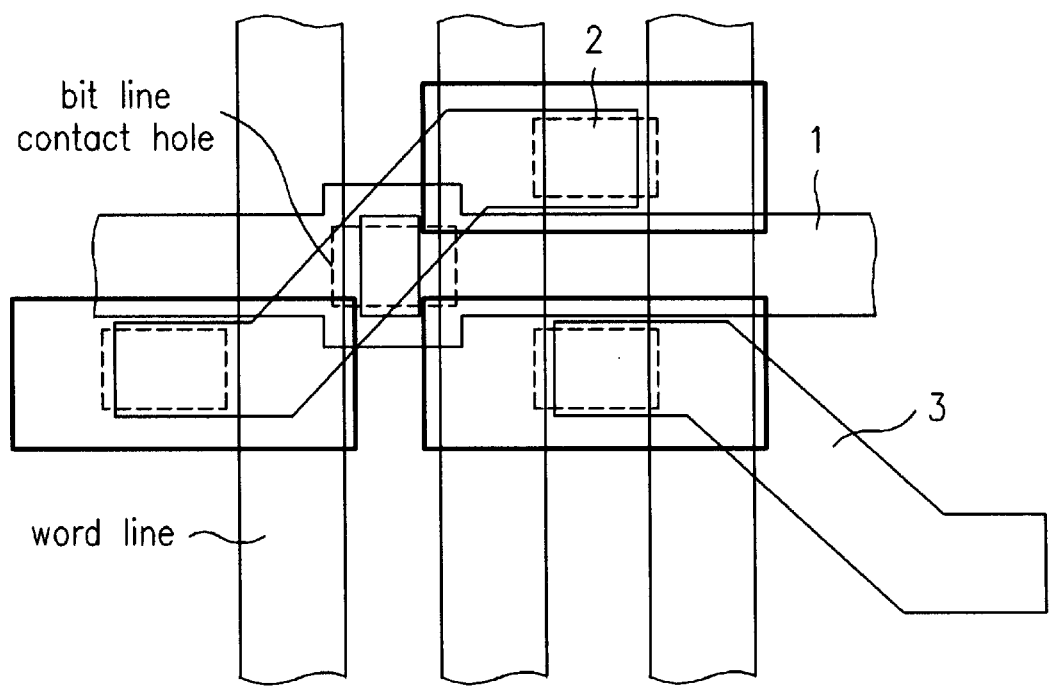
FIG. 1 is a layout showing an interconnection of a conventional semiconductor device.
Figure 2A:
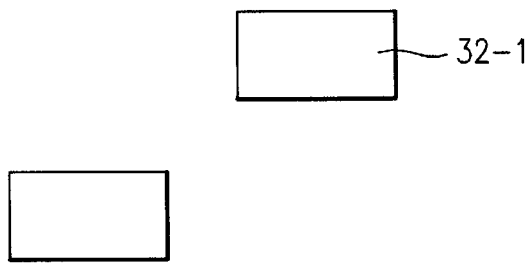
FIGS. 2A to 2F illustrate a process for forming patterns for a semiconductor device according to a first embodiment of the present invention.
Figure 2B:
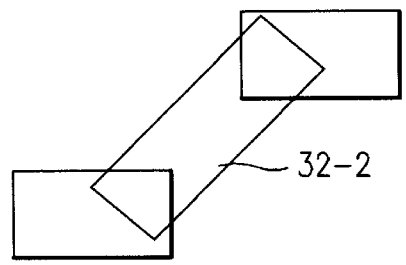
Figure 2C:
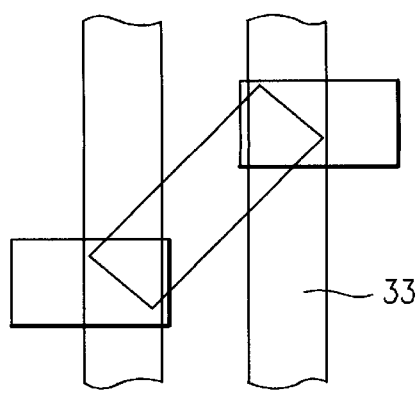
Figure 2D:
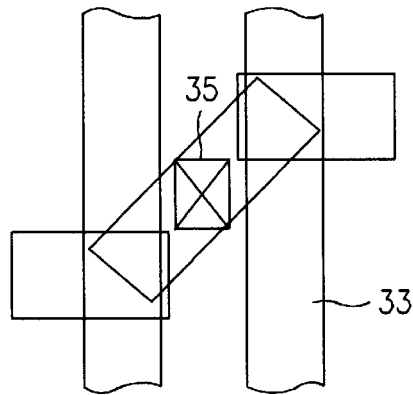
Figure 2E:
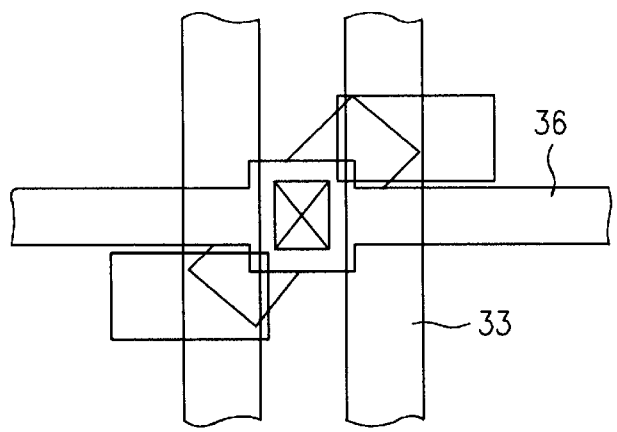
Figure 2F:
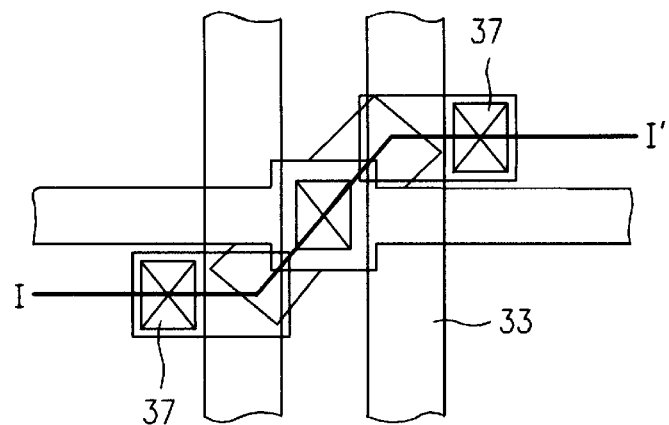

FIGS. 2A to 2F are layouts showing a process for forming patterns for a semiconductor device according to a first embodiment of the present invention, and FIGS. 3A to 3F are cross-sectional views showing a method for fabricating the patterns taken along the line I–I' of FIG. 2F.

In the formation of a memory cell according to the first embodiment of the present invention, an active region is formed to include a first active region pattern 32-1 having a portion to which a storage electrode is connected and a second active region pattern 32-2 having a portion to which a bit line is connected. The first active region pattern is formed before the second active region pattern is formed.

Figure 3A:
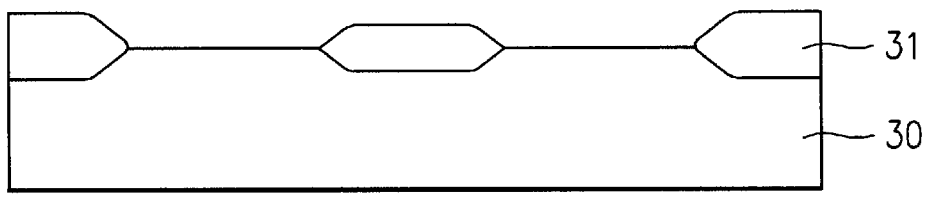
FIGS. 3A to 3F are cross-sectional views showing a method for fabricating patterns, taken along the line I–I' of FIG. 2F.

As shown in FIGS. 2A and 3A, first active region patterns 32-1 are formed on a semiconductor substrate 30, i.e., crystalline silicon substrate, using an oxidation stopper pattern (not shown) including an initial oxide layer and a silicon nitride layer formed in a stack. A field oxide layer 31 is formed on device isolation regions through a local oxidation of silicon (LOCOS).

Figure 3B:
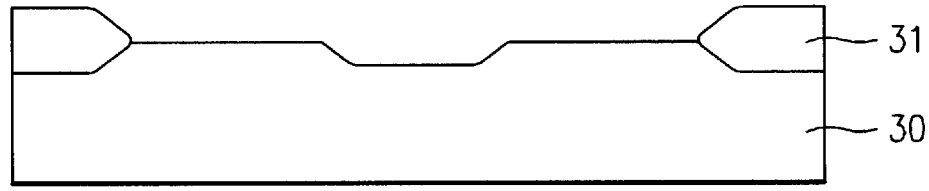

As shown in FIGS. 2B and 3B, field oxide layer 31 on the device isolation regions is selectively removed using a photoresist pattern (not shown) as a mask, to pattern a second active region 32-2. The first and second active regions 32-1 and 32-2, each of which do not have a curved portion, are combined to thereby form an active region pattern, which now has a curved portion at its central portion. The second active region 32-2 is superimposed on edge portions of the first active regions 32-1, as shown in FIG. 2B.

Figure 3C:
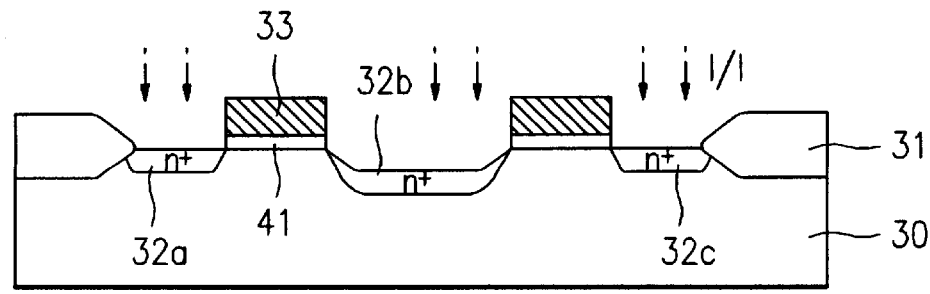

As shown in FIGS. 2C and 3C, an insulating layer 41 is formed on the substrate 30. Then, a doped polysilicon or a stack of polysilicon and silicide layers is formed on the insulating layer 41, and selectively etched to form word lines 33. An impurity having a conductivity type opposite to that of semiconductor substrate 30 is ion-implanted into the semiconductor substrate using word lines 33 as a mask. Then, heat treatment is carried out at a temperature in the range of about 800° C.–1000° C., to form impurity diffusion regions 32a, 32b, and 32c. The impurity diffusion regions 32a and 32c correspond to the first active region patterns and the impurity diffusion region 32b corresponds to the second active region pattern.

Figure 3D:
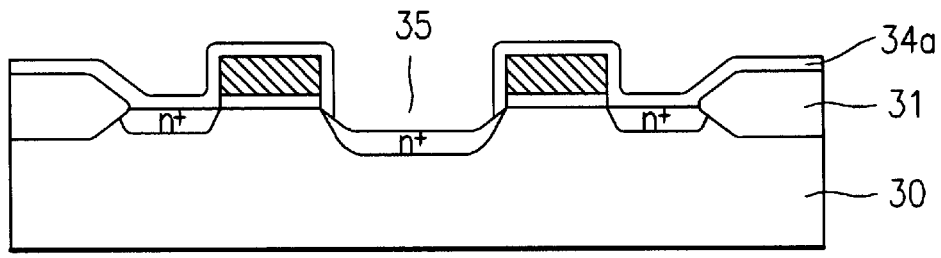
Figure 3E:
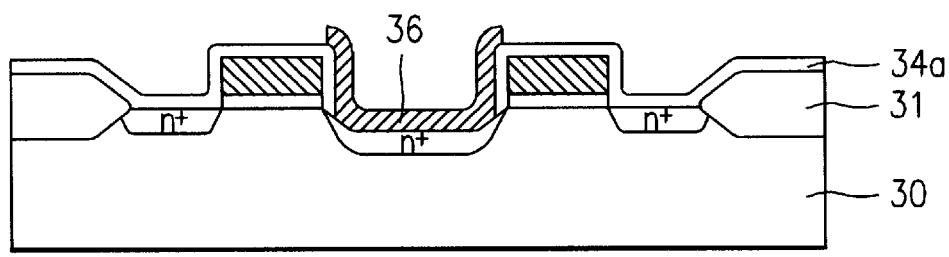

As shown in FIG. 3D, an insulating layer 34a, such as silicon oxide layer, is formed through the chemical vapor deposition (CVD). The insulating layer 34a is selectively etched to form a bit line contact hole 35, as shown in FIG. 2D, for connecting a bit line to the second active region 32-2. Then, as shown in FIGS. 2E and 3E, a stack of either doped polysilicon and silicide layers or doped polysilicon and metal layers is formed, which is selectively etched to form a bit line pattern 36 perpendicular to word lines 33.

Figure 3F:
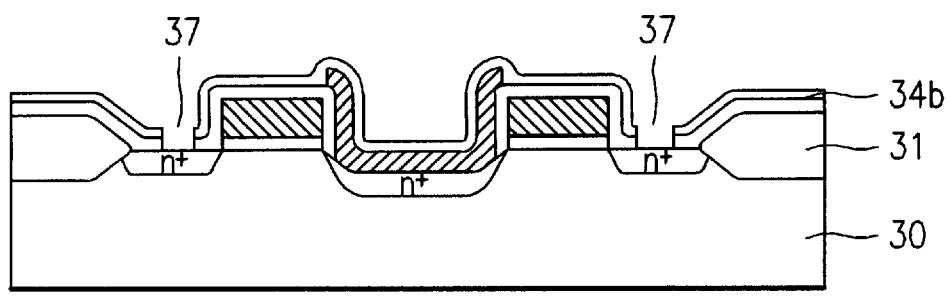

As shown in FIGS. 2F and 3F, an insulating layer 34b is formed over the overall surface of the substrate. Then, the insulating layer 34b is selectively etched to form storage electrode contact holes 37 to connect a storage electrode of a capacitor to the first active regions 32-1. Then, a storage electrode, dielectric layer and plate electrode are sequentially formed on the substrate, to form a capacitor of a memory cell, which is not shown in the drawing. Here, for the storage electrode and plate electrode, a doped polysilicon, a metal (such as tungsten) or a metal compound (such as TiN) may be used. For the dielectric layer, a laminated layer of silicon and nitride, or an oxide layer having a high dielectric constant such as $Ta_2O_3$ may be used.

A process for forming patterns for a semiconductor device in accordance with a second embodiment of the present invention will be explained below with reference to FIGS. 4A to 4F and 5A to 5F. FIGS. 4A to 4F illustrate a process for forming patterns according to the second embodiment of the present invention, and FIGS. 5A to 5F are cross-sectional views showing a method for fabricating the patterns, taken along the line II–II' of FIG. 4F.

In the formation of an active region pattern according to the second embodiment of the present invention, a first active region pattern 32-1 is formed before a word line pattern 33 is formed. Then, a second active region pattern 32-2 is formed. The first and second active region patterns are combined to form the active region.

Figure 4A:
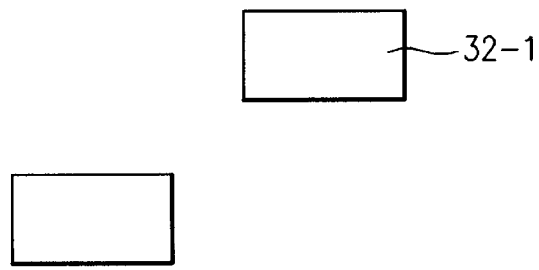
FIGS. 4A to 4F illustrate a process for forming patterns for a semiconductor device according to a second embodiment of the present invention.
Figure 5A:
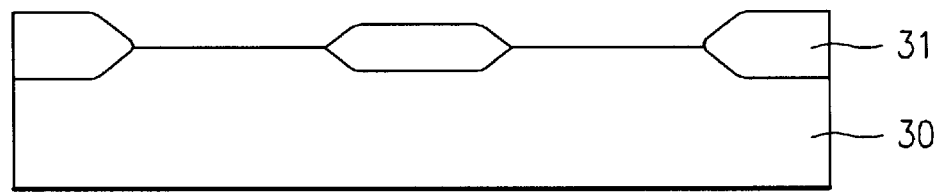
FIGS. 5A to 5F are cross-sectional views showing a method for fabricating patterns, taken along the line II–II' of FIG. 4F, FIGS. 6A to 6E illustrate a process for forming patterns for a semiconductor device according to a third embodiment of the present invention.

As shown in FIGS. 4A and 5A, first active region patterns 32-1 are formed on a semiconductor substrate 30, i.e., crystalline silicon substrate, using an oxidation stopper pattern (not shown) including an initial oxide layer and a silicon nitride layer formed in a stack. A field oxide layer 31 is formed on device isolation regions through the LOCOS.

Figure 4B:
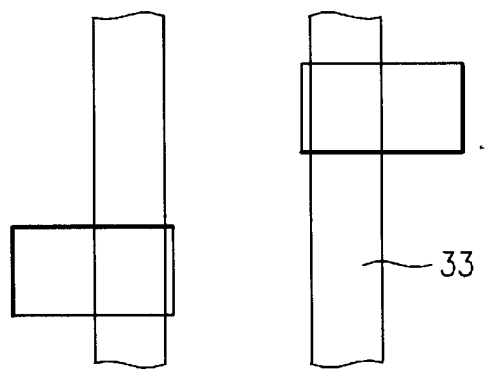
Figure 5B:
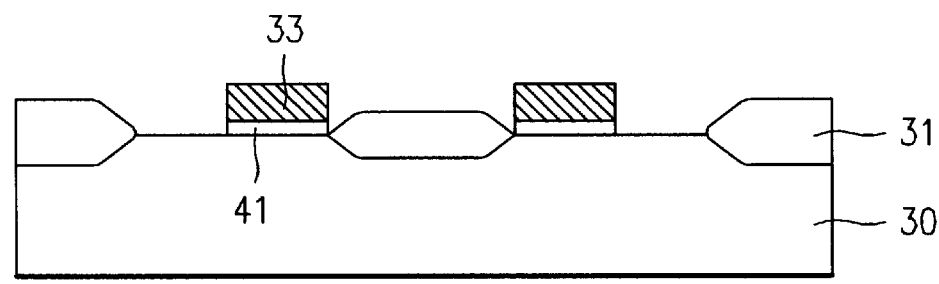

As shown in FIGS. 4B and 5B, an insulating layer 41 is formed on the substrate 30, and then a doped polysilicon layer or a stack of polysilicon and silicide layers is formed on the insulating layer 41. The insulating layer 31a and stack are selectively etched to form word lines 33.

Figure 4C:
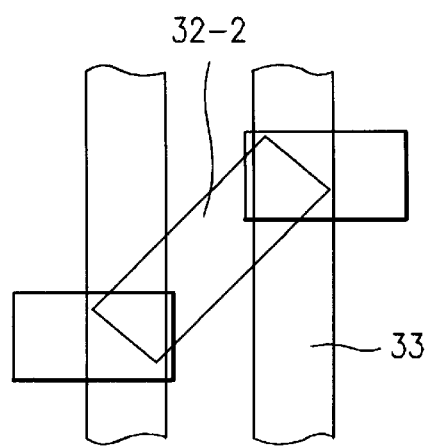
Figure 5C:
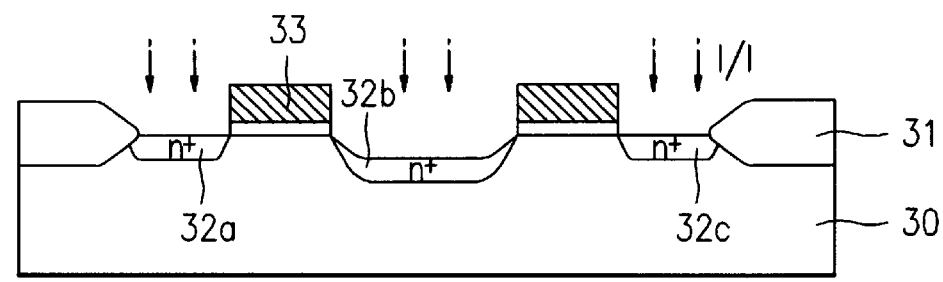

As shown in FIGS. 4C and 5C, field oxide layer 31 on the device isolation regions is selectively removed using a photoresist pattern (not shown) as a mask, to pattern a second active region 32-2. The second active region 32-2 is superimposed on edge portions of the first active regions 32-1, as shown in FIG. 4C. An impurity having a conductivity type (n+ type) opposite to that of semiconductor substrate 30 is ion-implanted into the semiconductor substrate using word lines 33 as a mask. Then, heat treatment is carried out at a temperature in the range of about 800° C.–1000° C., to form impurity diffusion regions 32a, 32b and 32c. The impurity diffusion regions 32a and 32c correspond to the first active region pattern and the is impurity diffusion region 32b corresponds to the second active region pattern.

Figure 4D:
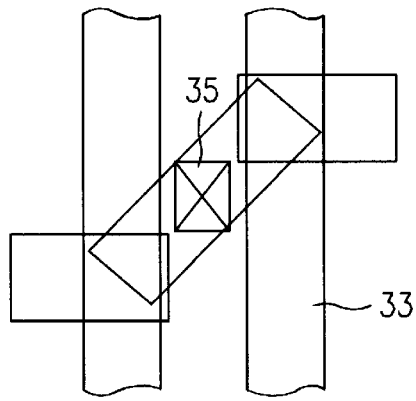
Figure 4E:
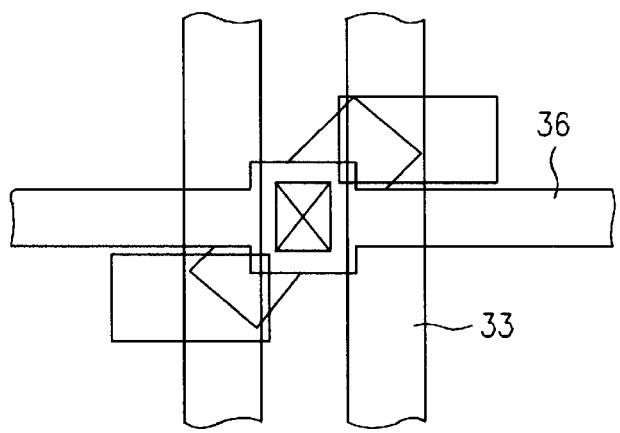
Figure 5D:
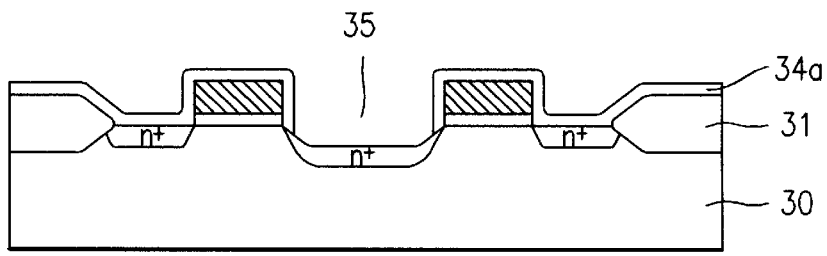
Figure 5E:
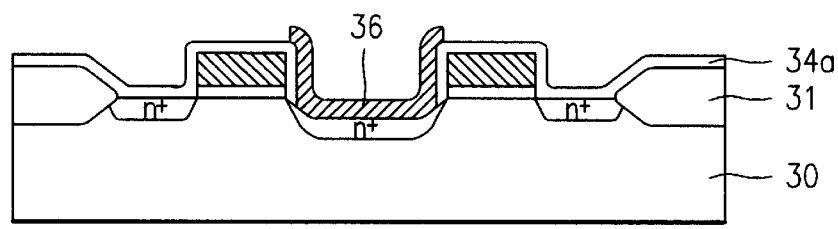

As shown in FIGS. 4D and 5D, an insulating layer 34a, such as silicon oxide layer, is formed through the CVD method, and then selectively etched to form a bit line contact hole 35 for connecting a bit line to the second active region 32-2. Then, as shown in FIGS. 4E and 5E, a stack of either doped polysilicon and silicide layers or doped polysilicon and metal layers is formed, which is selectively etched to form a bit line pattern 36 perpendicular to word lines 33.

Figure 4F:
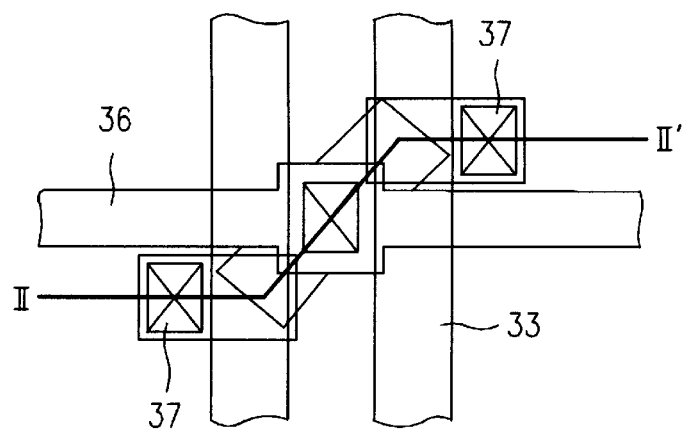
Figure 5F:
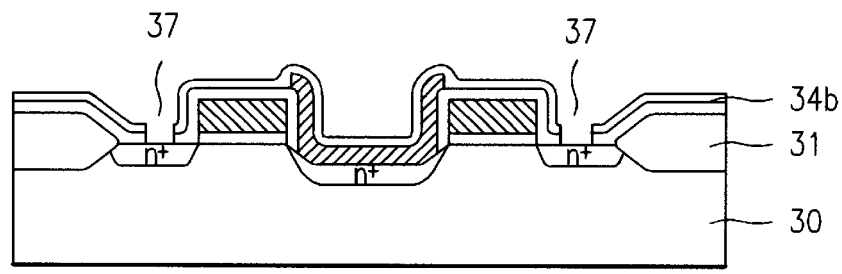

As shown in FIGS. 4F and 5F, an insulating layer 34b is formed over the overall surface of the substrate, and then selectively etched to form storage electrode contact holes 37 to connect a storage electrode of a capacitor to the first active regions 32-1.

In the first and second embodiments of the present invention, the bit line is formed prior to the formation of the capacitor However, in the present invention, the capacitor may be formed first before the bit line is formed, as follows. First, a contact hole for the storage electrode is formed on the first active region, and the storage electrode, dielectric layer, and plate electrode are sequentially formed to form the capacitor. Another contact hole for the bit line is formed on the second active region, and then the bit line is formed.

A process for forming patterns for a semiconductor device in accordance with a third embodiment of the present invention will be explained below with reference to FIGS. 6A to 6E and 7A to 7E. FIGS. 6A to 6E illustrate a process for forming patterns according to the third embodiment of the present invention, and FIGS. 7A to 7E are cross-sectional views showing a method for fabricating the patterns, taken along the line III–III' of FIG. 6E.

In the formation of an active region pattern according to the third embodiment of the present invention, an active region pattern is formed to be inclined at a predetermined angle ($\theta$) with a word line and a bit line. An impurity ion diffusion layer is formed on a portion of a semiconductor substrate, which has been exposed by the formation of a contact hole for connecting a storage electrode of a capacitor to the active region, to thereby form an extended pattern of the active region. By doing so, an active region pattern having a curve can be correctly formed, while at the same time, reducing the number of times masks are used. Thus, the third embodiment is different from the first and second embodiments. Moreover, processes in the third embodiment are simplified. Here, the predetermined angle ($\theta$) is in a range of about 0° to 90°, and preferably in a range of about 30° to 60°.

Figure 6A:
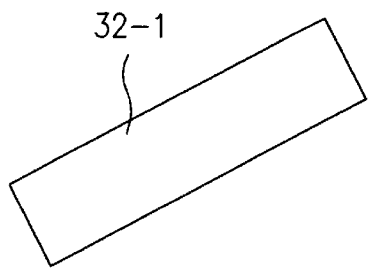
Figure 7A:
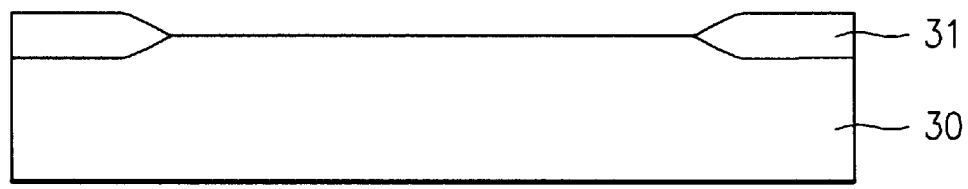
FIGS. 7A to 7E are cross-sectional views showing a method for fabricating patterns, taken along the line III–III' of FIG. 6E.

As shown in FIGS. 6A and 7A, first active region patterns 32-1 inclined at a predetermined angle are formed on a semiconductor substrate 30, i.e., crystalline silicon substrate, using an oxidation stopper pattern (not shown) including an initial oxide layer and a silicon nitride layer formed in a stack. A field oxide layer 31 is formed on a device isolation region through the LOCOS.

Figure 6B:
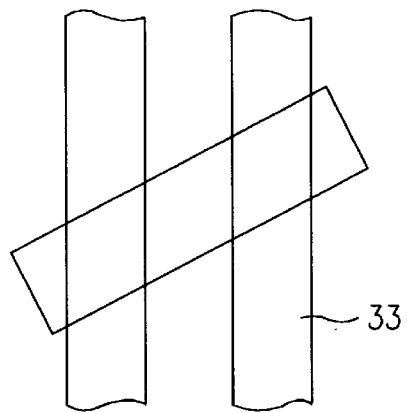
Figure 7B:
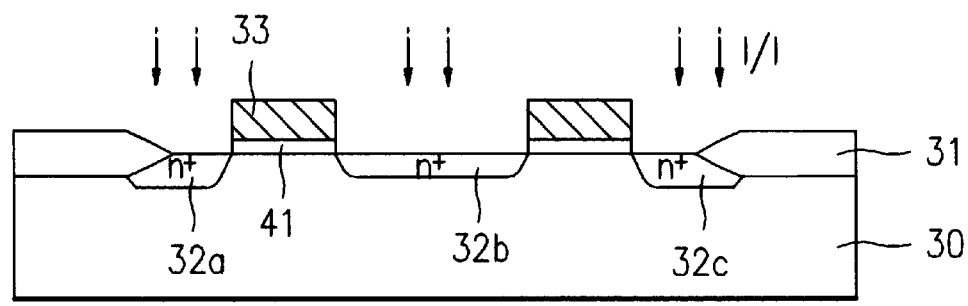

As shown in FIGS. 6B and 7B, an insulating layer 41 is formed on the substrate 30, and then a doped polysilicon layer or a stack of polysilicon and silicide layers is formed on the insulating layer 41. Then, the insulating layer 41 and stack are selectively etched to form word lines 33. An impurity having a conductivity type (n+ type) opposite to that of semiconductor substrate 30 is ion-implanted into the semiconductor substrate using word lines 33 as a mask. Then, heat treatment is carried out at a temperature in the range of about 800° C.–1000° C., to form impurity diffusion regions 32a, 32b, and 32c.

Figure 6C:
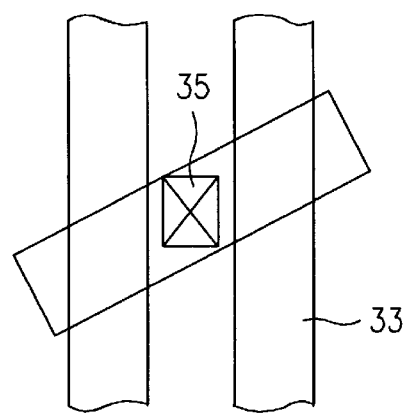
Figure 6D:
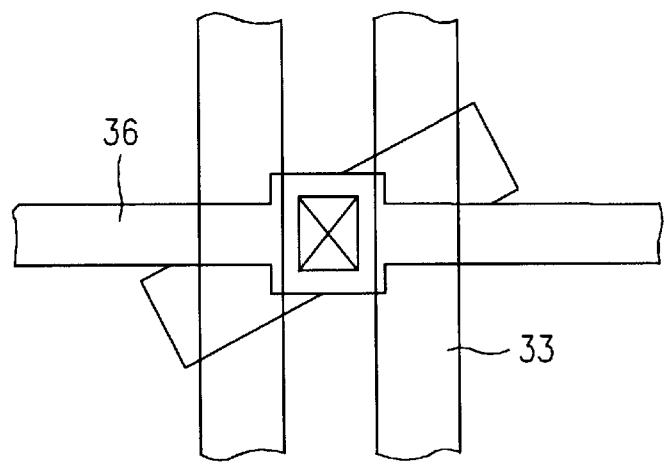
Figure 7C:
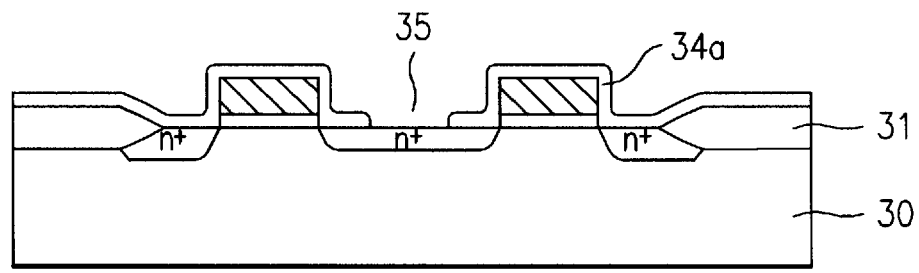
Figure 7D:
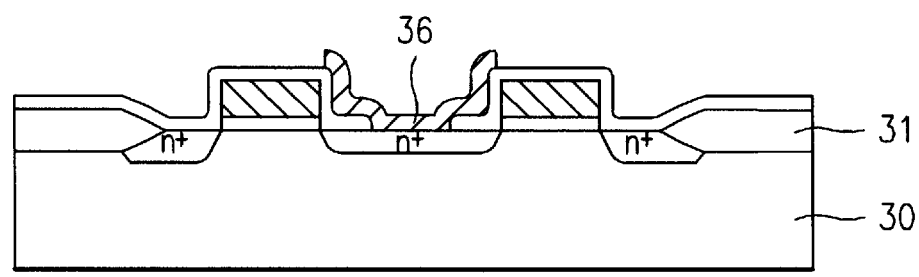

As shown in FIGS. 6C and 7C, an insulating layer 34a, such as silicon oxide layer, is formed through the CVD method, and then selectively etched to form a bit line contact hole 35 for connecting a bit line to the second active region 32-2. Then, as shown in FIGS. 6D and 7D, a stack of either doped polysilicon and silicide layers or doped polysilicon and metal layers is formed, and then selectively etched to form a bit line pattern 36 perpendicular to word lines 33.

Figure 6E:
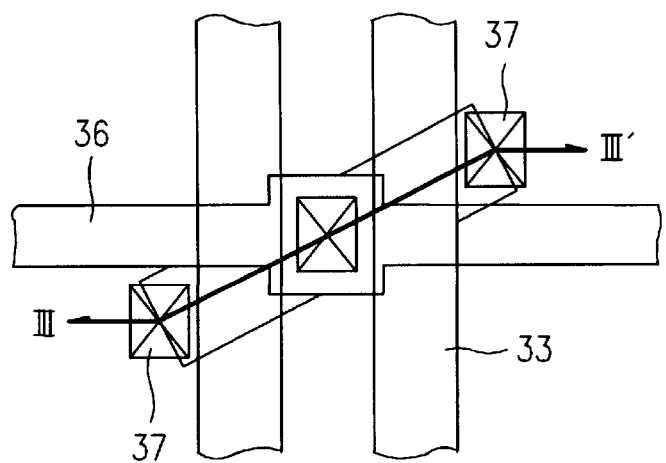
Figure 7E:
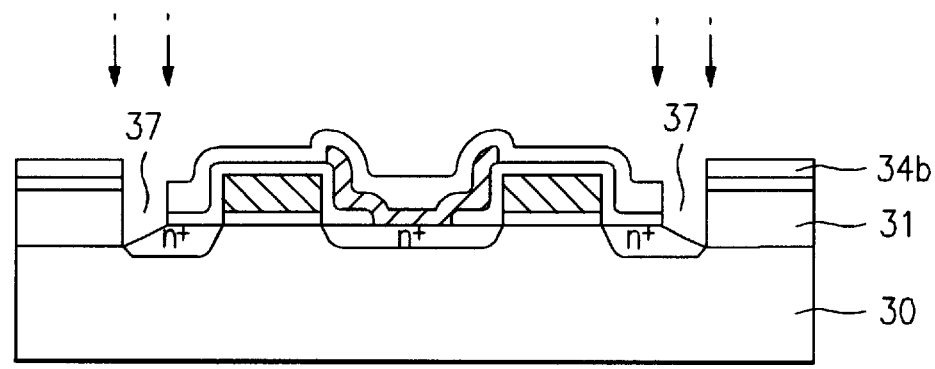

As shown in FIGS. 6E and 7E, an insulating layer 34b is formed and then selectively etched to form a storage electrode contact hole 37. Here, a portion on which storage electrode contact hole 37 is formed includes a portion of the first active region 32-1 and a curved portion extended from the first active region 32-1. That is, a predetermined portion of the field oxide layer 31 is removed. Then, an impurity having a conductivity type opposite to that of semiconductor substrate 30 is ion-implanted into storage electrode contact hole 37 and diffused through heat treatment.

A process for forming patterns for a semiconductor device in accordance with a fourth embodiment of the present invention will be explained below with reference to FIGS. 8A to 8E and 9A to 9E. FIGS. 8A to 8E illustrate a process for forming patterns according to the fourth embodiment of the present invention, and FIGS. 9A to 9E are cross-sectional views showing a method for fabricating the patterns, taken along the line IV–IV' of FIG. 8E.

In the formation of a pattern according to the fourth embodiment of the present invention, an active region is formed by combining active region patterns which are connected perpendicular to each other. That is, an active region pattern parallel to a bit line is formed and an impurity ion diffusion layer is selectively formed on a portion of a semiconductor substrate, which has been exposed during formation of a contact hole for connecting the bit line to the active region. Thus, an extended pattern of the active region is formed.

Figure 8A:
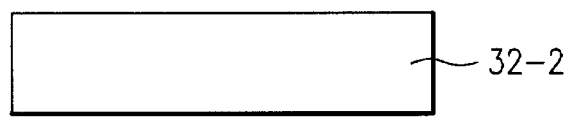
FIGS. 8A to 8E illustrate a process for forming patterns for a semiconductor device according to a fourth embodiment of the present invention.
Figure 9A:
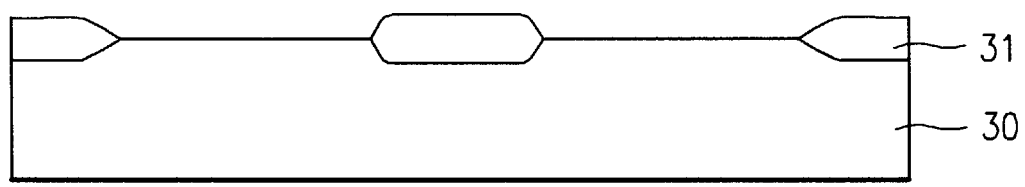
FIGS. 9A to 9E are cross-sectional views showing a method for fabricating patterns, taken along the line IV–IV' of FIG. 8E.

As shown in FIGS. 8A and 9A, second active region patterns 32-2 are formed parallel to a bit line (which is to be formed in a following process) and perpendicular to a word line (which is to be formed in a following process) on a semiconductor substrate 30, i.e., crystalline silicon substrate. A field oxide layer 31 is formed on a device isolation region through the LOCOS.

Figure 8B:
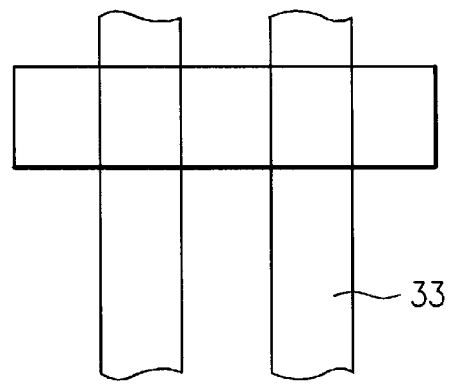
Figure 9B:
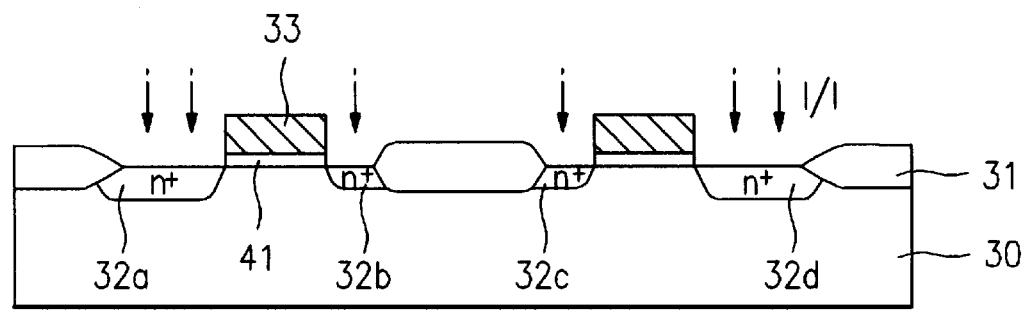

As shown in FIGS. 8B and 9B, an insulating layer 41 is formed on the substrate 30, and then a doped polysilicon layer or a stack of polysilicon and silicide layers is formed on the insulating layer 41. Then, the insulating layer 41 and stack are selectively etched to form word lines 33. An impurity having a conductivity type ($n^+$ type) opposite to that of semiconductor substrate 30 is ion-implanted into the semiconductor substrate using word lines 33 as a mask. Then, heat treatment is carried out at a temperature in the range of about 800° C.–1000° C., to form impurity diffusion regions 32a, 32b, 32c, and 32d.

Figure 8C:
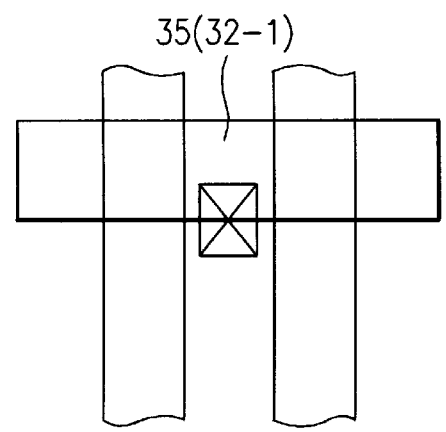
Figure 9C:
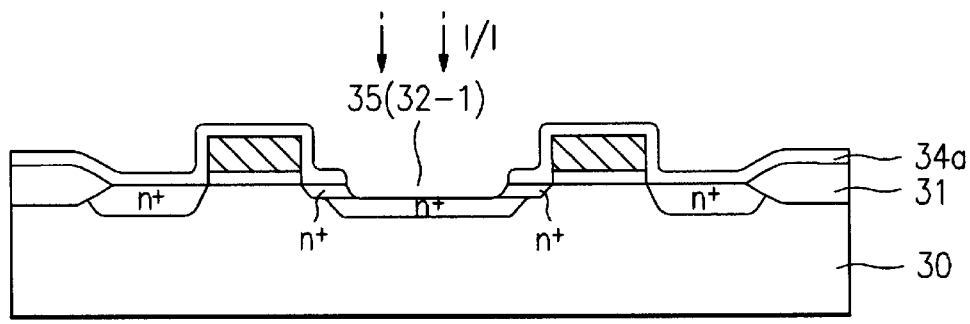

As shown in FIGS. 8C and 9C, an insulating layer 34a, such as silicon oxide layer, is formed through the CVD method, and then selectively etched to form a bit line contact hole 35 for connecting bit line 36 to a portion of the substrate 30. Here, the bit line is formed on a portion of the second active region 32-2. This is to connect the impurity diffusion region, on which bit line contact hole 35 is formed, to a first active region 32-1.

Figure 8D:
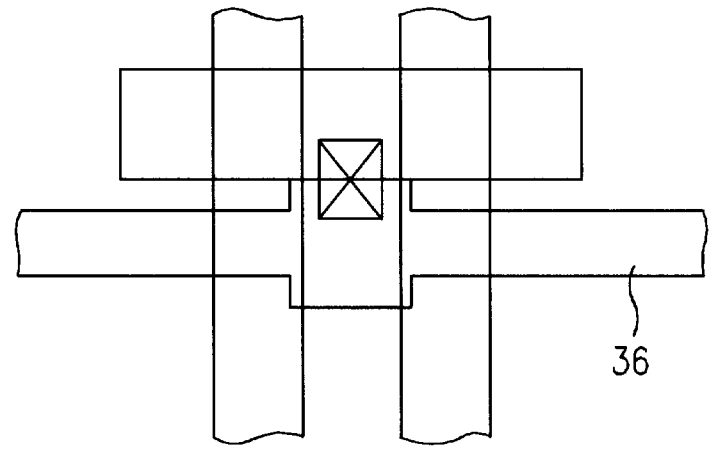
Figure 8E:
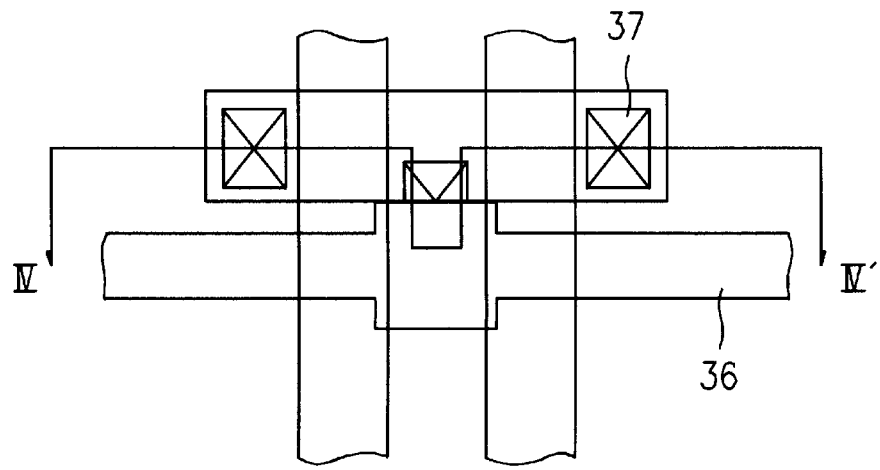
Figure 9D:
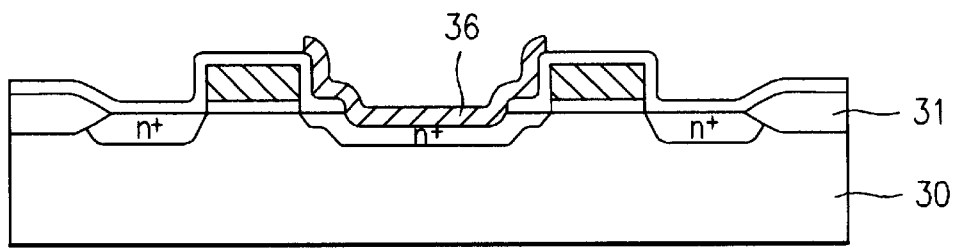
Figure 9E:
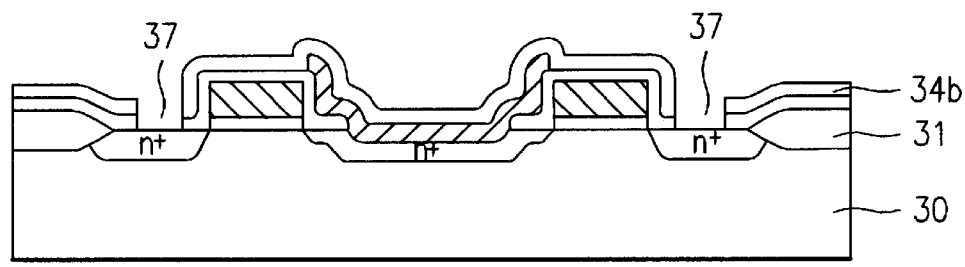

As shown in FIGS. 8D and 9D, a stack of either doped polysilicon and silicide layers or doped polysilicon and metal layers is formed, and then selectively etched to form a bit line pattern 36 parallel to word lines 33. Here, bit line pattern 36 is partially superimposed on bit line contact hole 35. Then, as shown in FIGS. 8E and 9E, an insulating layer 34b is formed. Then, the insulating layers 34a and 34b on the second active region 32-2 are selectively etched to form a storage electrode contact hole 37 for connecting a storage electrode of a capacitor to the active region.

In the fourth embodiment of the present invention, an active region pattern having a protrusion can be formed, and a bit line contact hole is formed to be superimposed partially on the second active region and bit line. This improves the density of a memory cell.

Accordingly, the present invention provides several methods for fabricating a semiconductor device in which patterns used to fabricate an integrated circuit are formed differently from those of conventional integrated circuits to improve the reliability and density of the semiconductor device.

As described above, the present invention has, among others, the following advantages. Since a pattern having a curved portion is formed by forming at least two straight patterns and combining the two straight patterns, it is possible to prevent the resultant pattern from being distorted. Here, the patterns to be combined may be sequentially formed, or after the formation of one of the patterns, another pattern may be formed, and then the other pattern may be formed. This improves the application of the processes. Furthermore, for the fourth embodiment of the present invention, for example, the bit line contact hole is formed to be superimposed partially on the bit line, to thereby increase the density of a memory cell.

It will be apparent to those skilled in the art that various modifications and variations can be made in the method for fabricating a semiconductor device of the present invention without departing from the spirit or scope of the invention. Thus, it is intended that the present invention cover the modifications and variations of this invention provided they come within the scope of the appended claims and their equivalents.

What is claimed is:

1. A method for fabricating a semiconductor device comprising the steps of:

forming a field oxide layer on a first conductivity-type semiconductor substrate, and forming a pattern of first active regions;

selectively removing the field oxide layer between the first active regions to pattern a second active region;

forming word lines substantially perpendicular to each of the first active regions;

ion-implanting a second conductivity-type impurity into the substrate using a mask to form first, second, and third impurity diffusion regions in the first and second active regions;

forming a first insulating layer over an overall surface of the substrate, and forming a first contact hole in the second active region;

forming a bit line for contacting with the second impurity diffusion region on the second active region through the first contact hole;

forming a second insulating layer over the first insulating layer and the bit line; and selectively removing the second insulating layer to form second contact holes on portions of the first active regions, respectively.

2. The method for fabricating a semiconductor device according to claim 1, wherein the first active regions are formed to have a substantially straight pattern.

3. The method for fabricating a semiconductor device according to claim 1, wherein the second active region is formed to have a substantially straight pattern.

4. The method for fabricating a semiconductor device according to claim 1, wherein the step of forming the second active region includes superimposing the second active region on edge portions of the first active regions, respectively.

5. The method for fabricating a semiconductor device according to claim 4, wherein the step of forming the second active region includes the step of superimposing the second active region on respective portions of the first active regions, and the first active regions and the second active region are combined to form a pattern with a curve.

6. The method for fabricating a semiconductor device according to claim 1, wherein the bit line is formed substantially perpendicular to the word lines.

7. The method for fabricating a semiconductor device according to claim 1, wherein the mask for ion-implanting the impurity includes the word lines.

8. The method for fabricating a semiconductor device according to claim 1, wherein the second contact holes are formed on portions of the first active regions where the word lines are not superimposed.

9. A method for fabricating a semiconductor device comprising the steps of:

forming a field oxide layer on a first conductivity-type semiconductor substrate, and forming a pattern of first active regions;

forming word lines substantially perpendicular to each of the first active regions;

thereafter, selectively removing the field oxide layer between the first active regions to pattern a second active region;

ion-implanting a second conductivity-type impurity into the substrate using a mask to form first, second, and third impurity diffusion regions in the first and second active regions;

forming a first insulating layer over an overall surface of the substrate, and forming a first contact hole in the second active region;

forming a bit line for contacting with the second impurity diffusion region on the second active region through the first contact hole;

forming a second insulating layer over the first insulating layer and the bit line; and selectively removing the second insulating layer to form second contact holes on portions of the first active regions, respectively.

10. The method for fabricating a semiconductor device according to claim 9, wherein the first active regions are formed to have a substantially straight pattern.

11. The method for fabricating a semiconductor device according to claim 9, wherein the second active region is formed to have a substantially straight pattern.

12. The method for fabricating a semiconductor device according to claim 9, wherein the step for forming the second active region includes superimposing the second active region on edge portions of the first active regions, respectively.

13. The method for fabricating a semiconductor device according to claim 12, wherein the step of forming the second active region includes the step of superimposing the second active region on respective portions of the first action regions, and the first active regions and the second active region are combined to form a pattern with a curve.

14. The method for fabricating a semiconductor device according to claim 9, wherein the bit line is formed substantially perpendicular to the word lines.

15. The method for fabricating a semiconductor device according to claim 9, wherein the mask for ion-implanting the impurity includes the word lines.

16. The method for fabricating a semiconductor device according to claim 9, wherein the second contact holes are formed on portions of the first active regions where the word lines are not superimposed.

17. The method for fabricating a semiconductor device according to claim 9, wherein the word lines are used to pattern the second active region as a self-aligning mask together with a photoresist pattern.

18. A method for fabricating a semiconductor device comprising the steps of:

forming a field oxide layer on a first conductivity-type semiconductor substrate to pattern a first active region at an angle;

forming word lines to cross over the first active region;

ion-implanting a second conductivity-type impurity into the substrate using a mask to form first, second, and third impurity diffusion regions in the first active region;

forming a first insulating layer over an overall surface of the substrate;

selectively removing the first insulating layer at a central portion of the first active region to form a first contact hole;

forming a bit line for contacting with the first impurity diffusion regions on the first active region through the first contact hole;

forming a second insulating layer over the first insulating layer and the bit line;

selectively removing the second insulating layer to form second contact holes on edges of the first active region including the field oxide layer to pattern a second active region; and ion-implanting a second conductivity-type impurity into the second active region to convert the first and third impurity diffusion regions to fourth impurity diffusion regions, the first and third impurity diffusion regions having areas smaller than the fourth impurity diffusion regions.

19. The method for fabricating a semiconductor device according to claim 18, wherein the first active region is formed to have a substantially straight pattern.

20. The method for fabricating a semiconductor device according to claim 18, wherein the second active region is formed to have a substantially straight pattern.

21. The method for fabricating a semiconductor device according to claim 18, the step of forming the second active region includes the step of superimposing the second active region on a portion of the first active region, and the first active region and the second active region are combined to form a pattern with a curve.

22. The method for fabricating a semiconductor device according to claim 18, wherein the bit line is formed substantially perpendicular to the word lines.

23. The method for fabricating a semiconductor device according to claim 18, wherein the first active region is formed at the angle in a range of about 0° to about 90°.

24. The method for fabricating a semiconductor device according to claim 18, wherein the mask for ion-implanting the impurity into the substrate includes the word lines.

25. The method for fabricating a semiconductor device according to claim 14, wherein the first contact hole is formed where the word lines are not superimposed.

26. A method for fabricating a semiconductor device comprising the steps of:

forming a field oxide layer on a first conductivity-type semiconductor substrate to pattern a first active region;

forming word lines on the first active region;

ion-implanting a second conductivity-type impurity into the substrate using a mask to form first, second, third, and fourth impurity diffusion regions in the first active region;

forming a first insulating layer over an overall surface of the substrate;

selectively removing the first insulating layer to form a first contact hole on a portion of the substrate including the field oxide layer to pattern a second active region;

ion-implanting a second conductivity-type impurity into the second active region to form a fifth impurity diffusion region, the second and third impurity diffusion regions being connected to each other through the fifth impurity diffusion region;

forming a bit line for contacting with the second impurity diffusion region of the second active region through the first contact hole;

forming a second insulating layer over the first insulating layer and the bit line; and selectively removing the second insulating layer to form second contact holes on edges of the first active region.

27. The method for fabricating a semiconductor device according to claim 26, wherein the first active region is formed to have a substantially straight pattern.

28. The method for fabricating a semiconductor device according to claim 26, wherein the second active region is formed to have a substantially straight pattern.

29. The method for fabricating a semiconductor device according to claim 26, wherein the bit line is formed substantially parallel with the first active region.

30. The method for fabricating a semiconductor device according to claim 26, wherein the mask for ion-implanting the impurity into the substrate includes the word lines.

* * * * *